United States Patent [19]

Tanigawa et al.

[11] Patent Number: 5,118,470
[45] Date of Patent: Jun. 2, 1992

[54] FINE COPPER WIRE FOR ELECTRONIC INSTRUMENTS AND METHOD OF MANUFACTURING THE SAME

[75] Inventors: Toru Tanigawa; Masaaki Kurihara, both of Nikko; Yasuji Fujii, Yokohama; Toshiaki Inaba, Hiratsuka, all of Japan

[73] Assignees: The Furukawa Electric Co., Ltd., Tokyo; Furukawa Special Metal Co., Ltd., Hiratsuka, both of Japan

[21] Appl. No.: 604,506

[22] Filed: Oct. 29, 1990

Related U.S. Application Data

[60] Division of Ser. No. 408,423, Sep. 14, 1989, Pat. No. 4,986,856, which is a continuation of Ser. No. 209,212, Jun. 20, 1988, abandoned.

[51] Int. Cl.$^5$ ................................................. C22C 9/00
[52] U.S. Cl. .................................................... 420/469
[58] Field of Search ......................................... 420/469

[56] References Cited

U.S. PATENT DOCUMENTS

| 4,676,827 | 6/1987 | Hosoda | 420/469 |
| 4,717,436 | 1/1988 | Hosoda | 148/432 |

*Primary Examiner*—Peter D. Rosenberg
*Attorney, Agent, or Firm*—Oblon, Spivak, McClelland, Maier & Neustadt

[57] ABSTRACT

A fine copper wire for electronic instruments is disclosed which comprises 0.05 to 10 ppm in total amount of either one or not less than two kinds of Ti, Zr, V, Hf, Cr, Ca, Mg, Y and rare-earth elements, 1 to 30 ppm pf oxygen and the remainder of Cu. A method of manufacturing therefor is described wherein the hot rolling is given to the ingot obtained by melting and casting in a nonoxidative atmosphere or in vacuum, then stretch processing and at least once or more times of intermediate annealing are repeated to finish to a fixed diameter of wire, and thereafter annealing is carried out under nonoxidative or reducible atmosphere to obtain desired mechanical characteristics.

7 Claims, 1 Drawing Sheet

FINE COPPER WIRE FOR ELECTRONIC INSTRUMENTS AND METHOD OF MANUFACTURING THE SAME

This is a division of application Ser. No. 07/408,423, filed on Sep. 14, 1989, now U.S. Pat. No. 4,986,856, which is a continuation of Ser. No. 07/209,212, filed Jun. 20, 1988, now abandoned.

BACKGROUND OF THE INVENTION

The present invention relates to a fine copper wire for electronic instruments and a method of manufacturing the same. The fine wire is suitable, in particular, as a bonding wire used for the manufacture of semiconductors.

In the manufacture of semiconductors such as transistor, IC, etc., a fine wire of Au, Al or alloy thereof with a wire diameter of 15 to 100 $\mu$m or thereunder is used between the electrode pad of Al connected to circuit elements and the lead of semiconductor for the connection of circuit elements on Si chip to external power source and for the giving and taking of external informations.

The fine wire of Al or Al alloy has an advantage in that the bonding to the electrode pad can be made with the same kind of metal, and is low in cost. However, since the ball bond is generally difficult from the reasons of being apt to be oxidized etc., the wedge bond using supersonic wave, which is poor in the productivity, has been adoped. Further, the fine wire of Al or Al alloy is poor in the corrosion resistance and, in particular, tends to cause the corrosion in the case of resin sealing type semiconductor due to the permeation of moisture. Therefore, it is used exclusively for the gas-tight sealing type semiconductor.

On the other hand, the fine wire of Au is not only excellent in the corrosion resistance, but also good in the bondability to Al. Therefore, it has an advantage to be utilized for the ball bonding, which is high in the productivity, and is sued widely with the resin sealing type semiconductor as a leader.

However, the material Au is not only conspicuously high in cost, but also liable to produce a fragile layer of intermetallic compounds, which is called purple plague, with Al or Al alloy of electrode pad under an environment of high temperature. As a result, the deterioration of bonding strength occurs with the lapse of time and the increase in the resistance of bonded area or, in a serious case, the break-down of wire comes to occur.

Moreover, the fine wire of Au does not adhere to the interface of resin and the gaps inevitably produced become the paths of moisture to allow it to permeate easily to the portion of electrode pad. Consequently, Al is corroded by Galvanic pair formed between Au and Al and the increase in the resistance of connection and the break-down of wire sometimes occur similarly to said purple plague. In particular, accompanying with the high integration and getting larger in size of chip and the miniaturization and pin-multiplication of package, a drastic lowering in the reliability resulting from the high temperature due to an increase in the density of heat generation, the shortening in the path of water vapor permeation and the increase in the probability of water vapor permeation is feared.

For there reasons, the development of fine wire which can be substituted for the fine wire of Au and the characteristics of which are also equal to or higher than those of fine wire of Au is desired. Although a fine wire of Cu is proposed for this purpose. the deformability thereof is inferior to that of Au and such problems that the cracks are generated under the electrode pad and the bonding between electrode pad and Al is insufficient are caused. In particular, with high-integration IC, fragile insulation layers of $SiO_2$ etc. exist most frequently under the electrode pad and the development of fine wire of Cu, which has the deformability of equal to or higher than that of Au, is desired.

With regard to the fine wire of Cu, a fine wire of Cu containing 0.1 to 2% (1000 to 2000 ppm) of Be, Sn, Zn, Zr, Cr or Fe in Cu is proposed in Japanese Unexamined Patent Publication No. Sho 57-149744. This is excellent in the mechanical strength at high temperature, but it is far hard compared with the fine wire of Au. For this reason, excessive mechanical stress is applied to the semiconductor chip or the circuit substrate upon bonding resulting in the occurrence of damages of chip such as the cracking, cratering, etc.

This fact is particularly remarkable in the ball bonding and the ball formed is joined to the electrode pad on the semiconductor chip by means of the thermo-sonic method combined with thermal pressing and ultrasonic wave energy. The conditions at this time are temperature of 150° to 350° C., load of 10 to 200 g, output of ultrasonic wave of 10 to 200 mW and time of 10 to 100 msec. And, the hard ball requires always high bonding conditions, which bring about not only the lowering in the reliability and the lowering in the productivity, but also the fatal defect causing said cracking.

Furthermore, with regard to the fine wire of Cu, a fine wire of Cu containing 5 to 20000 ppm of rare-earth elements is proposed in Japanese Unexamined Patent Publication No. Sho 59-139662, a fine wire of Cu containing 10 to 20000 ppm of rate-earth elements, alkaline earth elements, Pd, Pt, Au. Bi, Te, Ge, Si, In, Al, B, Cd, Ti, Hf, V, Nb, Tl or Y, in particular, 100 to 10000 ppm of Y, rare-earth elements or Hf is proposed in Japanese Unexamined Patent Publication No. 61-20693, a fine wire of Cu containing 5 to 50 ppm of Ti, Cr or Fe or 10 to 100 ppm of Ni or Co is proposed in Japanese Unexamined Patent Publication No. Sho 61-99645, and a fine wire of Cu containing 5 to 50 ppm of Zr or Nb or 10 to 100 ppm of Pd, Ag, In or Sn is proposed in Japanese Unexamined Patent Publication No. Sho 61-99646. All of these are Cu alloys having relatively high concentration, though not so much as the fine wire of Cu proposed in Japanese Unexamined Patent Publication No. Sho 57-149744 aforementioned, and thus there is a problem in the hardness of ball. According to the experimental experiences by the inventors, the hardness of the ball of Cu is influenced significantly by the purity, in particular, the elements that form the solid solution and the purer the softer. In this respect, RRR (Residual Resistivity Ratio) having spread as a practical index of the purity of Cu is reasonable as a measure of bondability. The fine wires of Cu proposed in said Patent Publications have RRR of 200 to 500, which is larger than 100 to 300 of tough pitch copper or oxygen-free copper used ordinarily for the electrical use, nevertheless is an extent being much the same. This fact is insufficient in the industrial use, for which the bonding of LSI or VLSI with particularly high integration is made at high speed.

As a result of diligent investigations in view of this situation, a fine copper wire for electronic instruments suitable for the bonding wire and a method of manufacturing therefor have been developed by the invention.

SUMMARY OF THE INVENTION

The thin copper wire of the invention is characterized by comprising 0.05 to 10 ppm in total amount of either one or not less than two kinds of Ti, Zr, V, Hf, Cr, Ca, Mg, Y and rare-earth elements, 1 to 30 ppm of oxygen and the remainder of Cu.

Moreover, the manufacturing method of the invention is characterized in that the alloy comprising 0.05 to 10 ppm in total amount of either one or not less than two kinds of Ti, Zr, V, Hf, Cr, Ca, Mg, Y and rare-earth elements (RE), 1 to 30 ppm of oxygen and the remainder of Cu is molten and casted in a nonoxidative atmosphere or in vacuum to convert to the ingot, the hot rolling is given to this, then drawing and at least once or more times of intermediate annealing are repeated to finish to a fixed diameter of wire, and thereafter annealing is carried out under a nonoxidative or reducible atmosphere to obtain desired mechanical characteristics.

DETAILED DESCRIPTION OF THE INVENTION

Figure 1:
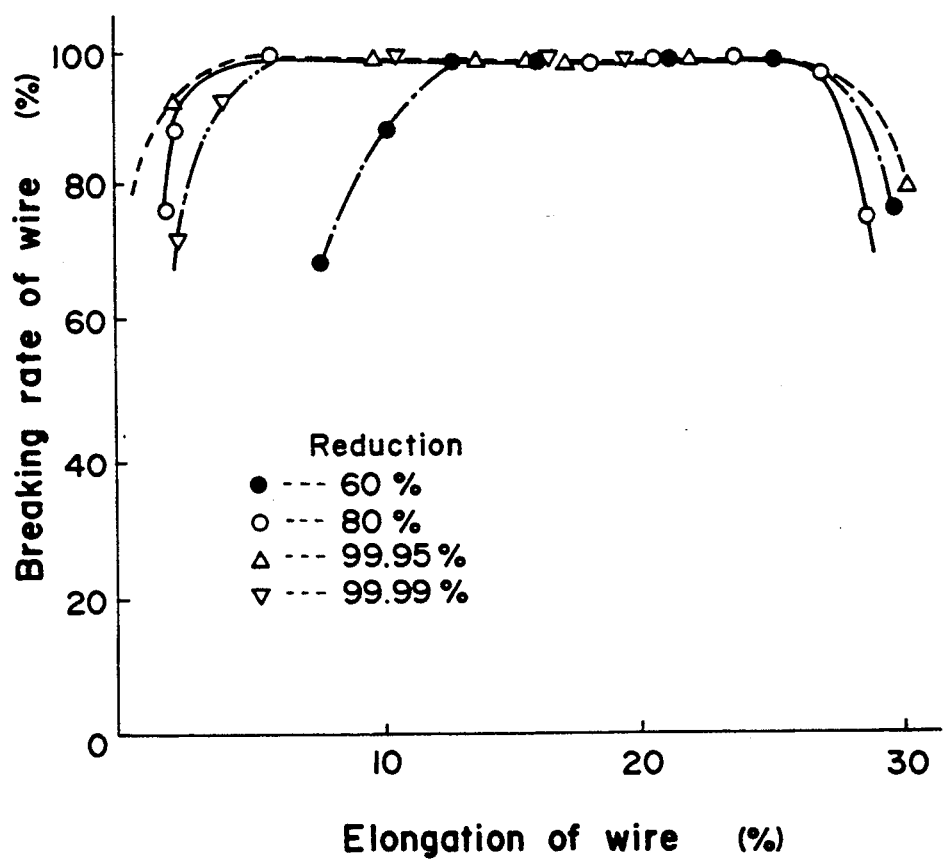
FIG. 1 shows the results that, among the breaking modes of fine wire ball-bonded to an alloy strip comprising Cu-0.15% Cr-0.1% Sn, the rates of normal break of wire were compared in terms of the rate of final drawing and the elongation of wire.

For the wire bonding between semiconductor elements and inner lead, the wedge bond by ultrasonic wave is sometimes used, but there are many examples to be ball-bonded. In the ball bonding, the tip of fine wire is molten by $H_2$ flame or electric discharge and formed into a ball due to the surface tension. At this time, the facts that the ball is close to the real sphere and not eccentric, that the ball is joined easily to the pad of Al which forms the electrode of chip, that the loop of fine wire retains a suitable height and the bonding strength to inner lead is sufficient, and the like are necessitated. Particularly, in bonding of high-integration IC where soft bonding conditions such as lower loading and lower output of ultrasonic wave are requested for the prevention from the mechanical damage, so-called cratering, of the chip, the bonding characteristics comparable with those of Au is required.

According to the invention, the requirements as above can be satisfied by using pure Cu containing 0.05 to 10 ppm in total amount of either one or not less than two kinds of Ti, Zr, V, Hf, Cr, Ca, Mg, Y and rare-earth elements (RE) and 1 to 30 ppm of coexistent oxygen, in particular, pure Cu with a purity of not less than 99.9999%. In the invention, the addition of said elements under 0.05 ppm exhibits no effect and that over 10 ppm is harmful inversely because the ball becomes hard. Moreover, the existence of oxygen under 1 ppm exhibits no effect and that over 30 ppm is harmful because it reacts with hydrogen in the atmosphere at the time of ball formation and void is produced in the ball to lower the reliability of ball bonding. The addition level of these varys depending on the purity of matrix Cu and can be made smaller with an enhancement in the purity.

Moreover, in the manufacture of said fine copper wire of the invention, the hot rolling is given to the ingot obtained by melting and casting in a nonoxidative atmosphere or in vacuum, then drawing and once or more times of intermediate annealing are repeated to finish to a fixed diameter of wire and thereafter annealing is carried out under nonoxidative or reducible atmosphere to obtain desired mechanical characteristics. By doing so, the bonding characteristics comparable with those of Au can be obtained. In such manufacturing process, if at least once of intermediate annealing is kept for not shorter than 30 minutes at not lower than 500° C., in particular, and thereafter cooling is made to not higher than 300° C. at a speed of not faster than 100° C. per minute, the ball bonding property can be made better further. Moreover, in said process, by making at least the reduction of final drawing 70 to 99.99%, preferably 90 to 99.9% and yet by making the elongation 5 to 25%, preferably 8 to 20% through final annealing, the fine copper wire better in the stitch bonding property can be obtained.

The reason why said actions are achieved in the invention is not clear, but, from the facts that the ball becomes harder as the elements that form the solid solution increase and that the ball bonding property becomes better by restricting the addition elements and oxygen to the ranges of the invention, it appears that the impurities in matrix Cu are fixed by the addition elements and oxygen. This is backed up also from the fact that the ball bonding property is improved by keeping at high temperature in the intermediate annealing at the time of manufacture.

With regard to the fine copper wire, the shape of loop and the strength of fine wire are practically important together with the ball and stitch bonding property as described. Although the mechanical characteristics of fine wire take part in these characteristics, the characteristics required vary depending on the kind of semiconductor device, bonding system and conditions. However, if the elongation is conspicuously low, the height of loop becomes high resulting in a cause to give rise to the short circuit between fine wires. In addition, the deformability of fine wire is small and, at the time of making stitch bond or wedge bond, high loading and high output of ultrasonic wave are needed to lower the bonding property. Whereas, if the elongation is conspicuously high, the height of loop becomes low resulting in a danger to bring about the contact with chip. Additionally, the collapse of wire at stitch bond becomes large and the neck portions tend to become fragile. Furthermore, the tail length of wire after bonding becomes non-uniform and such a status that the formation of ball cannot be made comes to occur. For this reason, said mechanical characteristics are effective in practice.

In order to develop these characteristics stably and advantageously in practice, at least the reduction of final drawing before annealing is necessary to be made 70 to 99.99%, preferably 90 to 99.95%, and further, if the elongation is adjusted to 5 to 25%, preferably 8 to 20% by annealing for a fixed time at a temperature of 150° to 400° C., more excellent characteristics can be derived.

In following, the invention will be illustrated in more detail based on the examples.

EXAMPLE 1

Employing a vacuum melting furnace, the addition elements were added to pure Cu with a purity of 99.9996% and the ingots (billets with a diameter of 25 mm and a length of 140 mm) having alloy compositions shown by No. 1 thru 23 in Table 1 were casted. After these ingots were shaven to make the diameter about 20 mm and the length about 100 mm, they were submitted to hot rolling to make the diameter about 10 mm and then via the scalping, the drawing was carried out.

In this drawing, the reduction of the drawing of 90% and the annealing at 350° C. were repeated to make the fine wires with a diameter of 25 μm. Finally, the running annealing was carried out in argon atmosphere making the temperature 250° to 400° C. to manufacture the fine wires with an elongation rate of about 15% ot do. Of these wires, the mechanical characteristics immediately after the manufacture and after the preservation for a month at room temperature subsequently to the manufacture were examined. Moreover, the fine wires were ball-bonded in 10% $H_2$-$N_2$ atmosphere with a manual type wire bonder under the bonding conditions set up as the load is 35 g, output of ultrasanic wave is 0.02W, time is 30 msec and stage temperature is 275° C. to test comparatively about the following items. These results are shown in Table 2 in comparison with conventional Au wire (FA-25, made by Tanaka Electronics). Besides, in Table 2, B1 and E1 indicate the breaking strength and the elongation, respectively.

(11) Shape of the ball (Degree of real sphere, eccentricity).
(2) Distortion of the ball (comparison of the ball diameter immediately after the balling-up with that after collapsed).
(3) Unbonded ball (Unsuccess rate of bonding when ball-bonded to Al with a thickness of 1 μm, which was metallized onto Si wafer).
(4) Chip cratering (This was shown by the number of electrode pads caused the crater when ball-bonded using ten 16-pin TTLICs).
(5) Breaking mode of the bonded wire (The position of breakdown when the wire pull test was conducted after bonding was observed judging whether it is at the bonded portion or at the wire cut. Result is shown by the rate (%) of wire breaking).
(6) Shape of the loop (With regard to the height and the lateral direction of loop after bonding, whether or not the average volue of slipping-off lies within 1.5 times of the diameter).

Besides, in the cases of item (5l) and (6), a plating-free alloy strip (thickness: 0.25 mm) comprising Cu-0.15% Cr-0.1% Sn was used as a substrate.

TABLE 1

| Fine wire | No. | Composition (ppm) | | | | | | | | | | |
|---|---|---|---|---|---|---|---|---|---|---|---|---|
| | | Cu | Ti | Zr | V | Hf | Cr | Ca | Mg | Y | La | Ce | $O_2$ |
| Fine wire of the invention | 1 | Balance | 0.55 | — | — | — | — | — | — | — | — | — | 8 |
| Fine wire of the invention | 2 | " | 0.82 | — | — | — | — | — | — | — | — | — | 14 |
| Fine wire of the invention | 3 | " | 0.63 | — | — | — | — | — | — | 1.1 | — | — | 20 |
| Fine wire of the invention | 4 | " | 1.4 | — | — | — | — | — | 0.88 | — | — | — | 7 |
| Fine wire of the invention | 5 | " | 0.92 | — | 1.1 | — | — | — | — | — | — | — | 10 |
| Fine wire of the invention | 6 | " | 0.14 | — | — | — | — | 0.14 | — | — | — | — | 12 |
| Fine wire of the invention | 7 | " | 2.3 | — | — | — | — | — | — | — | 0.91 | — | 4 |
| Fine wire of the invention | 8 | " | — | — | — | — | — | — | 0.97 | — | — | — | 8 |
| Fine wire of the invention | 9 | " | — | — | — | — | — | — | — | — | 2.9 | — | 4 |
| Fine wire of the invention | 10 | " | — | — | 0.63 | — | 0.16 | — | — | 0.14 | — | — | 12 |
| Fine wire of the invention | 11 | " | — | 2.2 | — | — | — | 1.8 | — | — | — | — | 6 |
| Fine wire of the invention | 12 | " | — | — | — | 2.2 | — | — | — | — | — | 2.4 | 24 |
| Fine wire of the invention | 13 | " | — | — | — | — | — | 4.3 | — | — | — | — | 12 |
| Fine wire of the invention | 14 | " | — | 0.41 | 3.9 | — | — | — | — | 3.2 | — | — | 7 |
| Comparative fine wire | 15 | " | — | — | — | — | — | — | — | — | — | — | 5 |
| Comparative fine wire | 16 | " | 2.3 | — | — | — | — | — | — | — | — | — | 53 |
| Comparative fine wire | 17 | " | — | 1.4 | — | — | — | — | — | 2.2 | — | — | 44 |
| Comparative fine wire | 18 | " | — | — | 4.2 | — | — | — | 13.8 | — | — | — | 8 |
| Comparative fine wire | 19 | " | — | — | — | 12.4 | — | — | 6.3 | — | — | — | 12 |
| Comparative fine wire | 20 | " | — | 40 | — | — | 212 | — | — | — | — | — | 23 |
| Comparative fine wire | 21 | " | — | — | — | — | — | — | 1640 | — | — | — | 51 |
| Comparative fine wire | 22 | " | — | — | 4318 | 744 | — | — | — | — | — | — | 18 |
| Comparative fine wire | 23 | " | 19 | 27 | — | — | 36 | — | — | — | — | — | 29 |

TABLE 2

| Fine wire | No. | Immediately after manufacture BI (g) | Immediately after manufacture El (%) | After preservation for a month BI (g) | After preservation for a month El (%) | Shape of ball | Distortion of ball | Unbonded rate of ball (%) | Shape of loop | Breaking rate of wire (%) | Cratering rate of chip (%) |
|---|---|---|---|---|---|---|---|---|---|---|---|
| Fine wire of the invention | 1 | 12.4 | 14.2 | 12.5 | 14.1 | Good | 0.6 | 5 | Good | 100 | 0 |
| Fine wire of the invention | 2 | 12.6 | 14.7 | 12.6 | 14.6 | " | 0.7 | 4 | " | " | " |
| Fine wire of the invention | 3 | 12.4 | 15.1 | 12.3 | 15.2 | " | 0.7 | 5 | " | " | " |
| Fine wire of the invention | 4 | 12.4 | 14.8 | 12.4 | 14.9 | " | 0.6 | 5 | " | " | " |
| Fine wire of the invention | 5 | 12.5 | 14.7 | 12.4 | 14.7 | " | 0.7 | 4 | " | " | " |
| Fine wire of the invention | 6 | 12.7 | 13.9 | 12.6 | 14.1 | " | 0.7 | 6 | " | " | " |
| Fine wire of the invention | 7 | 12.4 | 14.8 | 12.6 | 14.7 | " | 0.7 | 5 | " | " | " |
| Fine wire of the invention | 8 | 12.2 | 14.5 | 12.3 | 14.7 | " | 0.6 | 4 | " | " | " |
| Fine wire of the invention | 9 | 12.6 | 15.8 | 12.6 | 14.7 | " | 0.7 | 6 | " | " | " |
| Fine wire of the invention | 10 | 12.6 | 14.1 | 12.5 | 14.3 | " | 0.8 | 6 | " | " | " |
| Fine wire of the invention | 11 | 12.8 | 13.8 | 12.7 | 13.8 | " | 0.7 | 4 | " | " | " |
| Fine wire of the invention | 12 | 12.6 | 14.2 | 12.5 | 14.2 | " | 0.7 | 5 | " | " | " |
| Fine wire of the invention | 13 | 12.7 | 13.7 | 12.6 | 12.6 | " | 0.6 | 6 | " | " | " |
| Fine wire of the invention | 14 | 12.5 | 14.5 | 12.5 | 12.6 | " | 0.7 | 6 | " | " | " |
| Comparative fine wire | 15 | 12.4 | 14.7 | 11.9 | 16.4 | Slightly poor | 0.4 | 18 | Slightly poor | 98 | 6 |
| Comparative fine wire | 16 | 12.5 | 14.4 | 12.4 | 14.5 | Poor (void) | — | — | — | — | — |
| Comparative fine wire | 17 | 12.2 | 13.6 | 12.3 | 13.7 | Poor (void) | — | — | — | — | — |
| Comparative fine wire | 18 | 12.6 | 14.3 | 12.5 | 14.2 | Slightly poor | 0.6 | 9 | Slightly poor | 100 | 4 |
| Comparative fine wire | 19 | 12.3 | 14.1 | 12.3 | 14.2 | " | 0.6 | 8 | " | " | 6 |
| Comparative fine wire | 20 | 12.4 | 14.8 | 12.4 | 14.9 | " | 0.4 | 27 | " | 71 | 13 |
| Comparative fine wire | 21 | 12.4 | 14.1 | 12.3 | 14.5 | Poor (void) | — | — | — | — | — |
| Comparative fine wire | 22 | 12.7 | 14.0 | 12.6 | 14.2 | Poor | — | — | — | — | — |
| Comparative fine wire | 23 | 12.3 | 15.2 | 12.3 | 15.3 | Slightly poor | 0.4 | 36 | Slightly poor | 83 | 18 |
| Au wire | 24 | 12.1 | 4.1 | 12.2 | 4.3 | Good | 0.6 | 5 | Good | 100 | 0 |

As evident from Table 1 and Table 2, it can be seen that, with all of the fine wires of the invention No. 1 thru No. 14, results equal to conventional Au wire can be obtained. On the contrary, with comparative fine wire No. 15 without the addition ingredients, not only the bonding property is poor, but also the change of characteristics is caused upon the preservation at normal temperature, which results a significant insecure factor in the industrial utilization. Moreover, in the cases of comparative fine wires No. 16, No. 17 and No. 21 in which the contents of oxygen are excess, void is produced in the ball, and in the cases of comparative fine wires No. 18, No. 19, No. 20, No. 22 and No. 23 in which the addition elements are excess, unbonded ball and cratering are caused resulting in the poor bonding property.

EXAMPLE 2

Using pure Cu with a purity of 99.99998%, the fine copper wires with a diameter of 25 μm, which had the compositions shown in Table 3, were manufactured similarly to Example 1. These were ball-bonded to the lead frame (thickness: 0.2 mm, width: 33.02 mm) comprising Cu-0.15% Cr-0.1 % Sn alloy, which carried 42-pin LOGIC IC, with an auto-bonder (SWB-FA-CUB-10, made by Shinkawa) to evaluate the fine copper wires. The results are shown in Table 4 in comparison with conventional Au wire (FA-25, made by Tanaka Electronics).

TABLE 3

| Fine wire | No. | Composition (ppm) Cu | Ti | Zr | V | Hf | Cr | Ca | Mg | Y | La | Ce | $O_2$ |
|---|---|---|---|---|---|---|---|---|---|---|---|---|---|
| Thin wire of the invention | 25 | Balance | 0.06 | — | — | — | — | — | — | — | — | — | 3 |
| Thin wire of the invention | 26 | " | 0.74 | — | — | — | — | — | — | — | — | — | 18 |
| Thin wire of the invention | 27 | " | 1.2 | — | — | — | — | — | — | 0.95 | — | — | 0 |

TABLE 3-continued

| Fine wire | No. | Composition (ppm) | | | | | | | | | | |
|---|---|---|---|---|---|---|---|---|---|---|---|---|
| | | Cu | Ti | Zr | V | Hf | Cr | Ca | Mg | Y | La | Ce | $O_2$ |
| Thin wire of the invention | 28 | " | 0.98 | — | — | — | — | — | — | 1.7 | — | — | 12 |
| Thin wire of the invention | 29 | " | 0.63 | — | 0.86 | — | — | — | — | — | — | — | 15 |
| Thin wire of the invention | 30 | " | 0.04 | — | — | — | — | 0.12 | — | — | — | — | 12 |
| Thin wire of the invention | 31 | " | — | — | 0.04 | — | — | — | — | 0.06 | — | — | 14 |
| Thin wire of the invention | 32 | " | — | 1.2 | — | — | — | — | 0.13 | — | — | — | 5 |
| Thin wire of the invention | 33 | " | — | — | — | 0.42 | — | 0.13 | — | — | — | — | 4 |
| Thin wire of the invention | 34 | " | 2.1 | — | — | — | — | — | — | — | 0.42 | — | 23 |
| Thin wire of the invention | 35 | " | — | — | 0.96 | — | — | — | — | — | — | 0.27 | 8 |
| Thin wire of the invention | 36 | " | — | — | — | — | 5.2 | — | — | — | — | — | 14 |
| Thin wire of the invention | 37 | " | — | 0.03 | — | — | — | — | — | — | 0.04 | — | 26 |
| Thin wire of the invention | 38 | " | — | — | — | 6.2 | — | — | — | 2.4 | — | — | 13 |
| Comparative fine wire | 39 | " | — | — | — | — | — | — | — | — | — | — | 13 |
| Comparative fine wire | 40 | " | 0.13 | — | — | — | — | — | — | 0.24 | — | — | 44 |
| Comparative fine wire | 41 | " | — | — | 1.3 | — | — | — | — | — | 0.64 | — | 53 |
| Comparative fine wire | 42 | " | — | 4.6 | — | — | — | — | 13.8 | — | — | — | 23 |
| Comparative fine wire | 43 | " | — | — | — | — | 5.7 | — | — | — | — | 14.1 | 12 |
| Comparative fine wire | 44 | " | — | — | — | — | — | — | 2617 | — | — | — | 18 |
| Comparative fine wire | 45 | " | — | 76 | — | — | — | 664 | — | — | 379 | — | 24 |
| Comparative fine wire | 46 | " | — | — | 120 | — | 477 | — | — | — | — | — | 15 |

TABLE 4

| Fine wire | No. | Bl (g) | El (%) | Shape of ball | Shape of loop | Cratering rate of chip (%) | Breaking rate of wire (%) |
|---|---|---|---|---|---|---|---|
| Fine wire of the invention | 25 | 12.4 | 14.3 | Good | Good | 1 | 98 |
| Fine wire of the invention | 26 | 12.4 | 14.3 | " | " | 0 | 100 |
| Fine wire of the invention | 27 | 12.4 | 14.4 | " | " | 0 | " |
| Fine wire of the invention | 28 | 12.5 | 14.4 | " | " | 1 | " |
| Fine wire of the invention | 29 | 12.6 | 14.8 | " | " | 1 | 99 |
| Fine wire of the invention | 30 | 12.6 | 14.4 | " | " | 0 | 100 |
| Fine wire of the invention | 31 | 12.4 | 14.3 | " | " | 0 | 100 |
| Fine wire of the invention | 32 | 12.3 | 14.4 | " | " | 1 | 99 |
| Fine wire of the invention | 33 | 12.3 | 14.2 | " | " | 0 | 100 |
| Fine wire of the invention | 34 | 12.3 | 14.1 | " | " | 1 | 97 |
| Fine wire of the invention | 35 | 12.5 | 14.6 | " | " | 1 | 99 |
| Fine wire of the invention | 36 | 12.6 | 14.5 | " | " | 2 | 98 |
| Fine wire of the invention | 37 | 12.6 | 14.7 | " | " | 1 | 98 |
| Fine wire of the invention | 38 | 12.4 | 14.6 | " | " | 2 | 98 |
| Comparative fine wire | 39 | 12.6 | 14.3 | Slightly poor | Slightly poor | 16 | 77 |
| Comparative fine wire | 40 | 12.5 | 14.7 | Slightly poor (void appeared) | " | 18 | 91 |
| Comparative fine wire | 41 | 12.6 | 14.5 | Slightly poor (void appeared) | " | 12 | 92 |
| Comparative | 42 | 12.4 | 14.3 | Slightly poor | " | 14 | 95 |

TABLE 4-continued

| Fine wire | No. | Bl (g) | El (%) | Shape of ball | Shape of loop | Cratering rate of chip (%) | Breaking rate of wire (%) |
|---|---|---|---|---|---|---|---|
| fine wire Comparative fine wire | 43 | 12.4 | 14.3 | slightly poor (void appeared) | " | 6 | 94 |
| Comparative fine wire | 44 | 12.5 | 14.4 | Slightly poor (void appeared) | " | 34 | 68 |
| Comparative fine wire | 45 | 12.7 | 14.8 | Slightly poor (void appeared) | " | 28 | 78 |
| Comparative fine wire | 46 | 12.4 | 14.6 | Slightly poor (void appeared) | " | 27 | 72 |
| Au wire | 24 | 12.1 | 4.1 | Good | Good | 0 | 100 |

As evident from Table 3 and Table 4, with all of the fine wires of the invention No. 25 thru No. 38, good shape of the ball was obtained and the cratering rate of chip was also low. Whereas, in the cases of comparative fine wire No. 39 without the addition ingredients, comparative fine wires No. 40 and No. 41 with higher content of oxygen and comparative fine wires No. 42–No. 46 with excess addition ingredients it can be seen that the cratering of chip and the breaking of wire occur more frequently.

EXAMPLE 3

In Example 2, during the drawing, the wires with a diameter of 0.8 mm were annealed for 1 hour at 550° C. in Ar gas, cooled to 300° C. at a speed of 45° C./min, and then finished to the fine wires with a diameter of 25 µm similarly to Example 2 to make wire bonding.

The results are shown in Table 5 comparing with conventional Au wire (FA-25, made by Tanaka Electronics).

As evident from the comparison of Table 4 with Table 5, it can be seen that, with the fine wires of the invention No. 25 thru No. 38 without No. 26 thru No. 29 wherein at least once of intermediate annealing during the stretch processing was conducted by heating for hot shorter than 30 minutes at not lower than 500° C. and then cooling was made to not higher than 300° C. at a speed of not faster than 100° C./min, the cratering rate of chip and the breaking rate of wire are further improved.

EXAMPLE 4

In Example 1, the fine wire of the invention No. 8 was annealed during the stretch processing at a wire diameter of 0.8 mm in Ar gas under the conditions shown in Table 6 and other processings were kept similarly to Example 1 to convert to the fine wires with a diameter of 25 um. These were evaluated similarly to Example 2. The results are listed together in Table 6.

Besides, the cooling velocity in the table indicates an average cooling velocity to 300° C.

TABLE 5

| Fine wire | No. | Bl (g) | El (%) | Shape of ball | Shape of loop | Cratering rate of chip (%) | Breaking rate of wire (%) |
|---|---|---|---|---|---|---|---|
| Fine wire of the invention | 25 | 12.6 | 14.6 | Good | Good | 0 | 100 |
| Fine wire of the invention | 30 | 12.7 | 14.7 | " | " | 0 | 100 |
| Fine wire of the invention | 31 | 12.5 | 14.7 | " | " | 0 | 100 |
| Fine wire of the invention | 32 | 12.4 | 14.3 | " | " | 0 | 100 |
| Fine wire of the invention | 33 | 12.6 | 14.4 | " | " | 0 | 100 |
| Fine wire of the invention | 34 | 13.1 | 14.2 | " | " | 0 | 100 |
| Fine wire of the invention | 35 | 12.8 | 14.6 | " | " | 0 | 100 |
| Fine wire of the invention | 36 | 12.7 | 14.5 | " | " | 0 | 100 |
| Fine wire of the invention | 37 | 12.8 | 14.6 | " | " | 0 | 100 |
| Fine wire of the invention | 38 | 12.7 | 14.7 | " | " | 0 | 100 |
| Comparative fine wire | 39 | 12.6 | 14.4 | Slightly poor | Low | 8 | 86 |
| Comparative fine wire | 40 | 12.7 | 14.6 | " | Good | 12 | 93 |
| Comparative fine wire | 41 | 12.8 | 14.8 | " | " | 14 | 95 |
| Comparative fine wire | 42 | 12.5 | 14.6 | " | " | 7 | 94 |
| Comparative fine wire | 43 | 12.5 | 14.5 | " | " | 4 | 97 |
| Au wire | 24 | 12.1 | 4.1 | Good | " | 0 | 100 |

TABLE 6

| Fine wire | No. | Annealing conditions Temperature (°C.) | Time (hr) | Cooling velocity (°C./min) | Shape of ball | Distortion of ball | Shape of loop | Unbonded rate of ball (%) | Breaking rate of wire (%) | Cratering rate of chip (%) |
| --- | --- | --- | --- | --- | --- | --- | --- | --- | --- | --- |
| Fine wire of the invention | 8-1 | 550 | 4 | 82 | Good | 0.7 | Good | 0 | 100 | 0 |
| Fine wire of the invention | 8-2 | 625 | 0.7 | 54 | " | 0.7 | " | 0 | " | 0 |
| Fine wire of the invention | 8-3 | 625 | 1.5 | 63 | " | 0.8 | " | 0 | " | 0 |
| Fine wire of the invention | 8-4 | 850 | 1 | 48 | " | 0.7 | " | 0 | " | 0 |
| Comparative fine wire | 8-5 | 450 | 1 | 120 | " | 0.7 | " | 6 | " | 1 |
| Comparative fine wire | 8-6 | 625 | 1 | 153 | " | 0.6 | " | 5 | " | 2 |
| Comparative fine wire | 8-7 | 625 | 0.3 | 147 | " | 0.7 | " | 7 | " | 1 |
| Comparative fine wire | 8-8 | 850 | 1 | 169 | " | 0.6 | " | 6 | " | 2 |

As evident from Table 6, it can be seen that, when at least once of annealing was conducted during the drawing by heating for not shorter than 30 minutes at a temperature of not lower than 550° C. and cooling was made to not higher than 300° C. at a speed of not faster than 100° C./min, the unbonded rate of ball is decreased and the bonding property is improved.

EXAMPLE 5

In the manufacture of the fine wire of the invention No. 30 in Example 2, the fine wires having various elongations were produced by varying the final annealing temperature as well as making the reduction of final drawing 60, 80, 90, 95 and 99.99%. These were ball-bonded to a unplated alloy strip (thickness: 0.25 mm) comprising Cu-0.15% Cr-0.1% Sn similarly to Example 1 and the pull test thereof was conducted to determine the rate of breaking mode of fine wire. Results are shown in FIG. 1.

As evident from the figure, it can be seen that good bonding characteristics can be obtained at high reduction and within a range of the elongation of 5 to 25%.

EXAMPLE 6

In Example 3, using the fine wires of the invention No. 30 and No. 35, comparative fine wires No. 39 and No. 41 and conventional Au wire No. 24, the resin sealing according to the transfer mold method was carried out after the wire bonding. Thereafter, the high-temperature heating test for 1000 hours at 180° C. and the PC test under the conditions of 121° C. and 85% RH were performed. The number of tests was made about 50. The results of high-temperature heating test (number of failures, the results of PC test (number of failures) and the classification of failure modes are shown in Table 7, Table 8 and Table 9, respectively.

TABLE 7

| Fine wire | No. | Time (hr) 0 | 100 | 300 | 600 | 1000 |
| --- | --- | --- | --- | --- | --- | --- |
| Fine wire of the invention | 30 | 0/50 | 0/50 | 0/50 | 0/50 | 0/50 |
| Fine wire of the invention | 35 | 0/50 | 0/50 | 0/50 | 0/50 | 0/50 |
| Comparative fine wire | 39 | 3/50 | 3/50 | 3/50 | 4/50 | 4/50 |
| Comparative fine wire | 41 | 5/50 | 5/50 | 5/50 | 5/50 | 7/50 |
| Au wire | 24 | 0/50 | 0/50 | 1/50 | 3/50 | 8/50 |

TABLE 8

| Fine wire | No. | Time (hr) 0 | 100 | 300 | 600 | 1000 |
| --- | --- | --- | --- | --- | --- | --- |
| Fine wire of the invention | 30 | 0/50 | 0/50 | 0/50 | 0/50 | 0/50 |
| Fine wire of the invention | 35 | 0/50 | 0/50 | 0/50 | 0/50 | 0/50 |
| Comparative fine wire | 39 | 2/50 | 2/50 | 2/50 | 2/50 | 2/50 |
| Comparative fine wire | 41 | 5/50 | 5/50 | 5/50 | 5/50 | 6/50 |
| Au wire | 24 | 0/50 | 1/50 | 1/50 | 3/50 | 8/50 |

TABLE 9

| Fine wire | No. | High-temperature heating Short circuit | Increase in resistance(*) | Wire break | PCT Short circuit | Increase in resistance(*) | Wire break |
| --- | --- | --- | --- | --- | --- | --- | --- |
| Fine wire of the invention | 30 | 0 | 0 | 0 | 0 | 0 | 0 |
| Fine wire of the invention | 35 | 0 | 0 | 0 | 0 | 0 | 0 |
| Comparative fine wire | 39 | 3 | 1 | 0 | 2 | 0 | 0 |
| Comparative fine wire | 41 | 0 | 1 | 3 | 0 | 1 | 5 |
| Au wire | 24 | 0 | 6 | 2 | 0 | 7 | 1 |

(*)Fine increased by 50% more than rated value.

As evident from Table 7, Table 8 and Table 9, the fine wires of this invention No. 30 and No. 35 show good results in respective tests, but the comparative fine wires No. 39 and No. 41 are seen the failures being more frequent. Namely, with comparative fine wire No. 39, the failure was the short circuit due to the deformation of wire at the time of molding and, with comparative fine wire No. 41, it was mainly the break-down of wire due to the cracking of chip. On the other hand, with conventional Au wire No. 24, it was the purple plague accompanying with the diffusion of Au and Al through high-temperature heating and, in PCT, it was the damage of Al of electrode pad by corrosion due to the permeation of moisture, though there occurred also the diffusion.

Moreover, it exerts excellent effects that the bondability to Al of electrode pad is good in the ball bonding and the unbonded rate of ball is low. Furthermore, in accordance with the fine wire of the invention, the bonding characteristics more than equal to those of gold can be obtained also in the ball bond of high-integrated IC for which low loading and low output of ultrasonic wave are requested, because the mechanical damages of chip can be prevented.

As described, the fine wire of the invention is a fruit obtained by pursuing the characteristics of high-purity Cu. With regard to the long-term reliability besides said effects, it is known, as described above, that Al/Au forms a fragile interfacial layer through the diffusion in solid phase and tends to occur the purple plague phenomenon, but, in the case of Al/Cu, the occurrence is below one severalth compared with this. In this sense, too, the effect is extremely significant. For said reasons and others, the invention exerts remarkable effects industrially.

What is claimed is:

1. A fine copper wire for electronic instruments characterized by comprising an amount exceeding 0.1 ppm up to 2.52 ppm of one or more of Ti, Zr, Ca, Mg, V, Cr, and 1-30 ppm of oxygen and the remainder of Cu.

2. A fine copper wire for electronic instruments characterized by comprising:
   (a) at least one of Ti, Zr, Ca, Mg, V, Cr and
   (b) at least one of Y and rare-earth elements;
   wherein the sum of (a) and (b) exceeds 0.1 ppm up to 2.52 ppm, 1-30 ppm of oxygen and the remainder of Cu.

3. A fine copper wire for electronic instruments characterized by comprising an amount exceeding 2.52 ppm up to 10 ppm of one or more to Ti, Zr, Ca, Mg, V, Cr, 1-30 ppm of oxygen and the remainder of Cu.

4. A fine copper wire for electronic instruments characterized by comprising:
   (a) at least one of Ti, Zr, Ca, Mg, V, Cr and
   (b) at least one of Y and rare-earth elements;
   wherein the sum of (a) and (b) exceeds 2.52 ppm up to 10 ppm, 1-30 ppm of oxygen and the remainder of Cu.

5. A fine copper wire for electronic instruments characterized by comprising:
   at least one of Y and rare-earth elements;
   wherein the sum thereof is from 0.04 ppm to below 0.5 ppm, 1-30 ppm of oxygen, the remainder of Cu.

6. The fine copper wire of claims 2 or 4, wherein the amount of component (a) exceeds 0.1 ppm.

7. The fine copper wire for electronic instruments according to any one of claims 1-5, wherein pure copper with a purity of not less than 99.999% is used for Cu.

* * * * *

UNITED STATES PATENT AND TRADEMARK OFFICE
CERTIFICATE OF CORRECTION

PATENT NO. : 5,118,470
DATED : June 2, 1992
INVENTOR(S) : Toru Tanigawa et al.

It is certified that error appears in the above-identified patent and that said Letters Patent is hereby corrected as shown below:

Title page, item [30] should be added,

--June 25, 1987 [JP] Japan..........62-158482--.

Signed and Sealed this

Thirteenth Day of July, 1993

Attest:

MICHAEL K. KIRK

Attesting Officer     Acting Commissioner of Patents and Trademarks